(12) United States Patent
Yi et al.

(10) Patent No.: US 9,224,619 B2
(45) Date of Patent: *Dec. 29, 2015

(54) SEMICONDUCTOR DEVICE AND FABRICATING METHOD THEREOF

(71) Applicant: SAMSUNG ELECTRONICS CO., LTD., Suwon-si, Gyeonggi-do (KR)

(72) Inventors: Seol-Min Yi, Seoul (KR); Dae-Hyun Moon, Gyeonggi-do (KR); Joon-Seok Moon, Seoul (KR); Se-Keun Park, Gyeonggi-do (KR); Hyeoung-Won Seo, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/502,345

(22) Filed: Sep. 30, 2014

(65) Prior Publication Data

US 2015/0221742 A1 Aug. 6, 2015

(30) Foreign Application Priority Data

Feb. 4, 2014 (KR) .................. 10-2014-0012616

(51) Int. Cl.
| | | |
|---|---|---|
| H01L 29/66 | (2006.01) | |
| H01L 21/3213 | (2006.01) | |
| H01L 29/423 | (2006.01) | |
| H01L 27/108 | (2006.01) | |
| H01L 27/22 | (2006.01) | |
| H01L 21/28 | (2006.01) | |
| H01L 29/49 | (2006.01) | |

(52) U.S. Cl.
CPC .... *H01L 21/32133* (2013.01); *H01L 27/10814* (2013.01); *H01L 27/10823* (2013.01); *H01L 27/10876* (2013.01); *H01L 27/228* (2013.01); *H01L 29/4236* (2013.01); *H01L 29/42376* (2013.01); *H01L 21/28088* (2013.01); *H01L 29/4966* (2013.01)

(58) Field of Classification Search
CPC .................. H01L 29/7813; H01L 29/7825
USPC .................. 257/330, 331, 332, 334
See application file for complete search history.

(56) References Cited

U.S. PATENT DOCUMENTS

| | | | |
|---|---|---|---|
| 7,525,133 B2 | 4/2009 | Ohta et al. | |
| 7,563,677 B2 | 7/2009 | Yoo et al. | |
| 7,838,364 B2 | 11/2010 | Kim et al. | |
| 8,120,099 B2 | 2/2012 | Seo et al. | |
| 8,153,489 B2 | 4/2012 | Song | |
| 2014/0291755 A1* | 10/2014 | Baek et al. | .............. 257/330 |

FOREIGN PATENT DOCUMENTS

| | | |
|---|---|---|
| KR | 1020070017787 | 2/2007 |
| KR | 1020100132197 | 12/2010 |

* cited by examiner

*Primary Examiner* — Tan N Tran
(74) *Attorney, Agent, or Firm* — F. Chau & Associates, LLC

(57) ABSTRACT

The semiconductor device includes a substrate, a trench formed in the substrate, a gate insulation layer conformally formed on the inner surface of the trench, buried gate electrodes formed on the gate insulation layer and filling a portion of the trench, and a capping layer formed on the buried gate electrodes and filling the trench. The buried gate electrode include a first gate electrode and a second gate electrode surrounding a bottom portion of the first gate electrode, and an air gap is provided between a top portion of the first gate electrode and the gate insulation layer.

13 Claims, 8 Drawing Sheets

SEMICONDUCTOR DEVICE AND FABRICATING METHOD THEREOF

CROSS-REFERENCE TO RELATED APPLICATION

This application claims priority under 35 U.S.C. §119 to Korean Patent Application No. 10-2014-0012616 filed on Feb. 4, 2014 in the Korean Intellectual Property Office, the disclosure of which is incorporated by reference herein in its entirety.

Exemplary embodiments of the present inventive concept relate to a semiconductor device and a fabricating method thereof.

A buried channel array transistor (BCAT), including a gate electrode buried in a trench, has been proposed to overcome a short channel effect. However, according to how much the gate electrode is buried in the trench, BCAT characteristics including, for example, gate induced drain leakage (GIDL), or a current amount, may vary.

SUMMARY

Exemplary embodiments of the present inventive concept provide a semiconductor device, which can improve current amount and GIDL characteristics.

Exemplary embodiments of the present inventive concept also provide a fabricating method of a semiconductor device, which can improve both current amount and GIDL characteristics.

According to an exemplary embodiment of the present inventive concept, a semiconductor device may include a substrate, a trench formed in the substrate, a gate insulation layer conformally formed on the inner surface of the trench, buried gate electrode formed on the gate insulation layer and filling a portion of the trench, and a capping layer formed on the buried gate electrodes and filling the trench, wherein the buried gate electrode includes a first gate electrode and a second gate electrode surrounding a bottom portion of the first gate electrode, and an air gap is provided between a top portion of the first gate electrode and the gate insulation layer.

According to an exemplary embodiment of the present inventive concept a fabricating method of a semiconductor device may include forming a trench in a substrate, conformally forming a gate insulation layer on the trench, forming a first gate electrode and a second gate electrode on the gate insulation layer, the first gate electrode filling a portion of the trench and the second gate electrode surrounding sidewalls and a bottom surface of the first gate electrode, recessing a top portion of the second gate electrode to expose sidewalls of a top portion of the first gate electrode, and forming a capping layer filling the trench on the first gate electrode, wherein an air gap is formed on the second gate electrode.

According to an exemplary embodiment of the present inventive concept, a semiconductor device including a switch transistor may include a substrate, a trench formed in the substrate, a gate insulation layer conformally formed on the inner surface of the trench, a buried gate electrode formed on the gate insulation layer and filling a portion of the trench, a capping layer formed on the buried gate electrodes and filling the trench, and a source/drain formed in the substrate adjacent to the buried gate electrode. The buried gate electrode includes a first gate electrode and a second gate electrode surrounding a bottom portion of the first gate electrode, and an air gap is provided between a top portion of the first gate electrode and the gate insulation layer.

BRIEF DESCRIPTION OF THE DRAWINGS

The above and other aspects of the present inventive concept will become more apparent by describing in detail exemplary embodiments thereof with reference to the attached drawings in which.

DETAILED DESCRIPTION OF THE EMBODIMENTS

Figure 1:
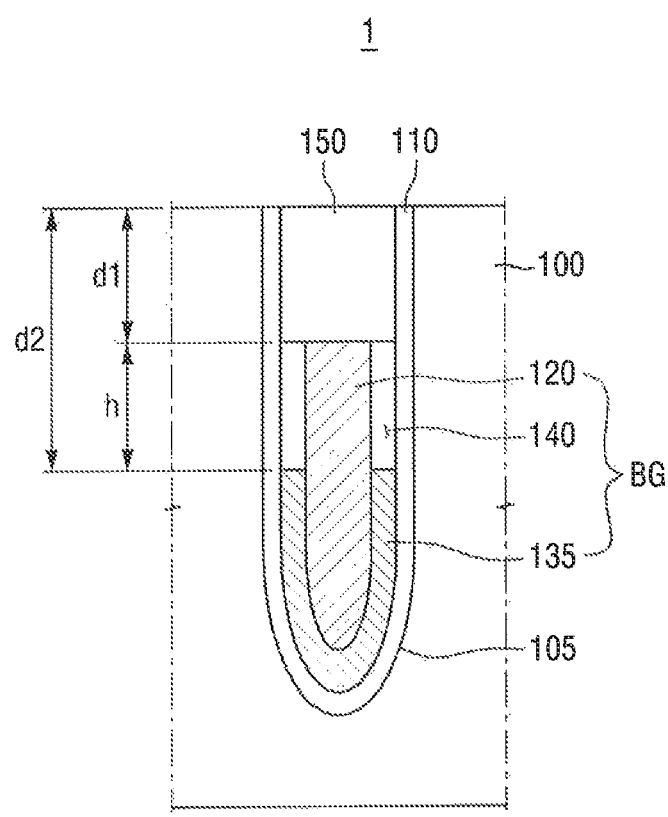
FIG. 1 illustrates a semiconductor device according to an exemplary embodiment of the present inventive concept.

Exemplary embodiments of the present inventive concept will now be described more fully hereinafter with reference to the accompanying drawings, in which some exemplary embodiments are shown. The present inventive concept may, however, be embodied in many different forms and should not be construed as being limited to the embodiments set forth herein. Like reference numerals may refer to like elements throughout the specification and drawings.

The terminology used herein is for the purpose of describing particular embodiments only and is not intended to be limiting of the inventive concept.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present.

It will be understood that, although the terms first, second, etc, may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Hereinafter, a semiconductor according to an exemplary embodiment of the present inventive concept will be described with reference to the accompanying drawings. FIG. 1 illustrates a semiconductor device according to an exemplary embodiment of the present inventive concept.

Referring to FIG. 1, the semiconductor device 1 according to an exemplary embodiment of the present inventive concept may include a substrate 100, a trench 105, a gate insulation layer 110, a buried gate electrode BG, an air gap 140, and a capping layer 150. The semiconductor device 1 may be a first conductivity type (e.g., N type) transistor, but exemplary embodiments of the present inventive concept are not limited thereto.

The substrate 100 may have a structure in which a base substrate and an epitaxial layer are stacked, but exemplary embodiments of the present inventive concept are not limited thereto. The substrate 100 may be a silicon substrate, a gallium arsenide substrate, or a silicon germanium substrate. Alternatively, the substrate 100 may be a silicon on insulator (SOI) substrate. In the following description, the embodiments will be described with regard to a silicon substrate by way of example.

The trench 105 may be formed in the substrate 100. The trench 105 may have various shapes. For example, the trench 105 may have a round shape in connection parts between its bottom surface and sidewalls, as in the illustrated embodiment. Alternatively, the trench 105 may be shaped such that its sidewall is tilted with a constant angle.

The gate insulation layer 110 may be conformally formed on the inner surface of the trench 105. The gate insulation layer 110 may be formed along sidewalls and a bottom surface of the trench 105. The gate insulation layer 110 may include at least one of silicon oxide, silicon nitride, silicon oxynitride or a high-k dielectric material. For example, the high-k material may include $HfO_2$, $HfSiO_4$, $HfAlO$, $ZrO_2$, $ZrSiO_4$, $TaO_2$, $Ta_2O_5$, and/or $Al_2O_3$, but exemplary embodiments of the present inventive concept are not limited thereto. The gate insulation layer 110 need not be formed on a top surface of the substrate 100.

The buried gate electrode BG may be formed on the gate insulation layer 110. The buried gate electrode BG may include a first gate electrode 120 and a second gate electrode 135.

The first gate electrode 120 may be formed in the trench 105 to fill at least a portion of the trench 105, without completely filling the trench 105. A top surface of the first gate electrode 120 may be formed to have a first depth d1 from a top surface of the substrate 100. The first gate electrode 120 may include a conductive material including, for example, a metal, such as tungsten (W), but exemplary embodiments of the present inventive concept are not limited thereto.

The second gate electrode 135 may be formed in the trench 105 to fill at least a portion of the trench 105 without completely filling the trench 105. The second gate electrode 135 may be formed between the first gate electrode 120 and the gate insulation layer 110, such that a top surface of the second gate electrode 135 is formed to have a second depth d2 from the top surface of the substrate 100. The second depth d2 may be greater than the first depth d1. In such a manner, the second gate electrode 135 may be formed to surround a bottom portion of the first gate electrode 120 (for example, a bottom surface and lower sidewalls of the first gate electrode 120). A top surface of the second gate electrode 135 may be positioned to be lower than the top surfaces of the substrate 100 and the first gate electrode 120. The second gate electrode 135 may include a conductive material, for example, a metal such as titanium nitride (TiN), but exemplary embodiments of the present inventive concept are not limited thereto. The second gate electrode 135 may be a layer directly contacting the gate insulation layer 110 and contributing a threshold voltage, and may adjust a work function required for the semiconductor device 1.

The air gap 140 may be positioned between a top portion of the first gate electrode 120 and the gate insulation layer 110. The air gap 140 may be formed at opposite sides of the first gate electrode 120. The air gap 140 may be formed between the second gate electrode 135 and the capping layer 150 to be described in more detail below. The air gap 140 may be surrounded by the first gate electrode 120, the second gate electrode 135, the gate insulation layer 105 and the capping layer 150. A top surface of the air gap 140 may be coplanar with the top surface of the first gate electrode 120. The air gap 140 may have a height h corresponding to a difference between the first depth d1 and the second depth d2. Alternatively, a top surface of the air gap 140 may be lower than the top surface of the first gate electrode 120. Therefore, the height h of the air gap 140 may be smaller than the difference between the first depth d1 and the second depth d2.

The capping layer 150 may be formed on the first gate electrode 120 to fill the trench 105. The capping layer 150 may be formed on the air gap 140 and the first gate electrode 120. The capping layer 150 may be formed in the air gap 140 to be deeper than the top surface of the first gate electrode 120. The capping layer 150 may include, for example, an oxide film, a nitride film, or an oxynitride film, but exemplary embodiments of the present inventive concept are not limited thereto. Here, the capping layer 150 is described with regard a nitride film, by way of example.

Although not specifically shown, sources/drains may be formed in the substrate 100 at opposite sides of the trench 105. The sources/drains may be doped with an N type impurity, for example.

In the semiconductor device 1 shown in FIG. 1, including a buried channel array transistor (BCAT), both of a gate induced drain leakage (CAW characteristic and a current amount characteristic can be improved by the air gap 140.

The air gap 140 greatly reduces electric fields derived from the buried gate electrodes 120 and 135 (for example, an electric field derived from the first gate electrode 120), thereby reducing leakage current. In detail, a strong electric field is generated between gate-drain regions of the BCAT. GIDL of the BCAT may be generated by the strong electric field. However, if the air gap 140 is provided between the gate insulation layer 110 and the first gate electrode 120, like in the semiconductor device 1 shown in FIG. 1, a dielectric constant between the gate-drain regions is reduced, so that the electric field is reduced, thereby reducing leakage current.

In addition, the air gap 140 can greatly reduce compressive stress due to a difference in the thermal expansion coefficients of a capping layer 150 and a silicon substrate. In a case where the semiconductor device 1 is a first conductivity type (e.g., N type) transistor, as the compressive stress is reduced, the mobility of carriers (e.g., electrons) of the semiconductor device 1 increases, thereby increasing the amount of current.

Accordingly, the BCAT having low leakage current and high current characteristics can be formed.

FIGS. 2 to 6 illustrate intermediate process steps for a fabricating method of a semiconductor device according to an exemplary embodiment of the present inventive concept.

Figure 2:
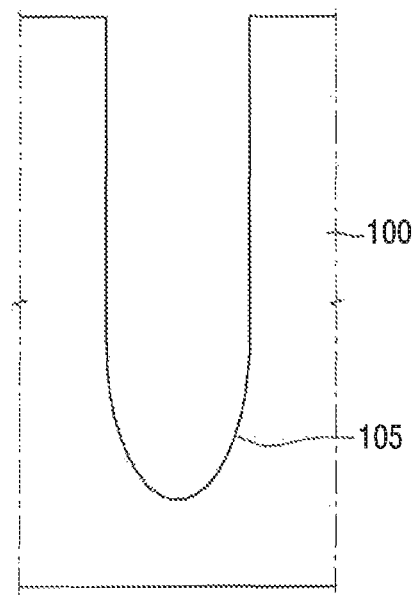
FIGS. 2 to 6 illustrate intermediate process steps for a fabricating method of a semiconductor device according to an exemplary embodiment of the present inventive concept.

Referring to FIG. 2, the trench 105 is formed in the substrate 100. For example, a mask pattern may be formed on the substrate 100 using a photolithography process. The mask pattern exposes a region of the substrate 100, where the trench 105 is to be formed. The mask pattern may be an oxide film, a nitride film, an oxynitride film, or the like, but exemplary embodiments of the present inventive concept are not limited thereto. The trench 105 is formed by dry etching the region of the substrate 100 using the mask pattern. After forming trench 105, the mask pattern may be removed.

Before forming the mask pattern, impurity regions for forming sources/drains may be formed in the substrate 100.

Figure 3:
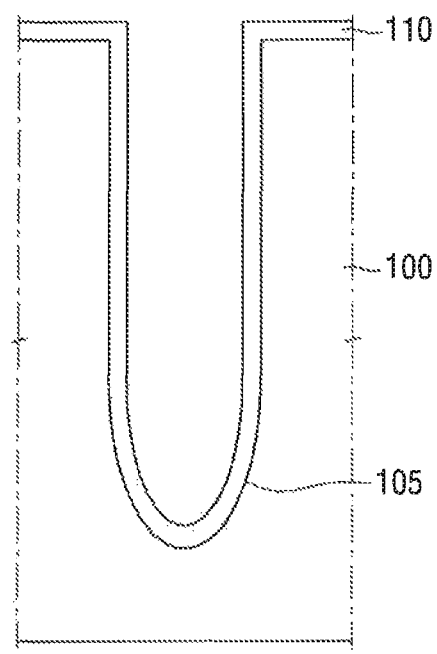

Next, referring to FIG. 3, the gate insulation layer 110 may be conformally formed on the substrate 100 having the trench 105. The gate insulation layer 110 may be formed along the bottom surface and sidewalls of the trench 105. The gate insulation layer 110 may be formed by, for example, chemical vapor deposition (CVD) or atomic layer deposition (ALLY). The gate insulation layer 110 may be formed using at least one of a silicon oxide film, a silicon nitride film, a silicon oxynitride film or a high-k dielectric material. For example, the high-k material may include, HfO$_2$, HfSiO$_4$, HfAlO, ZrO$_2$, ZrSiO$_4$, TaO$_2$, Ta$_2$O$_5$, or Al$_2$O$_3$, but exemplary embodiments of the present inventive concept are not limited thereto.

Figure 4:
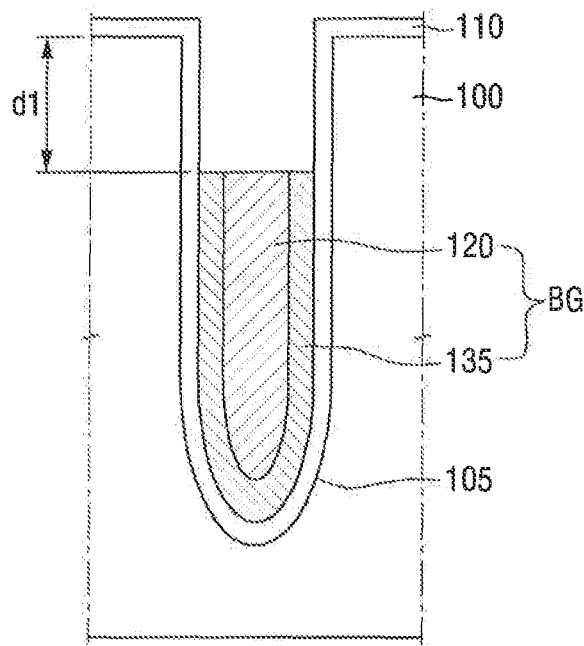

Next, referring to FIG. 4, the buried gate electrodes BG filling a portion of the trench 105 may be formed on the gate insulation layer 110. The buried gate electrodes BG include the first gate electrode 120 and the second gate electrode 135 surrounding the sidewalls and bottom surface of the first gate electrode 120.

For example, the second gate electrode 135 and the first gate electrode 120 are sequentially formed on the agate insulation layer 110 to fill the trench 105, followed by etching back. Accordingly, the top surface of the first gate electrode 120 may be formed to have the first depth d1 from the top surface of the substrate 100. The first gate electrode 120 may be formed using a conductive material, for example, a metal such as tungsten (W). The second gate electrode 135 may be formed between the first gate electrode 120 and the gate insulation layer 110. The top surface of the second gate electrode 135, like the top surface of the first gate electrode 120, may be formed to have the first depth d1 from the top surface of the substrate 100. The second gate electrode 135 may be formed to surround both sidewalls of the first gate electrode 120. The second gate electrode 135 may be formed using a conductive material, for example, a metal such as titanium nitride (TiN). The top surface of the first gate electrode 120 and the top surface of the second gate electrode 135 may be coplanarly positioned.

Figure 5:
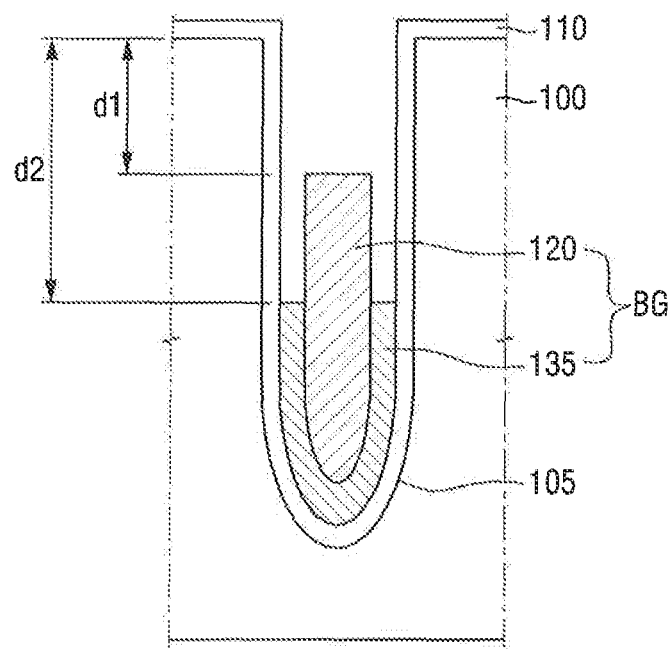
Figure 6:
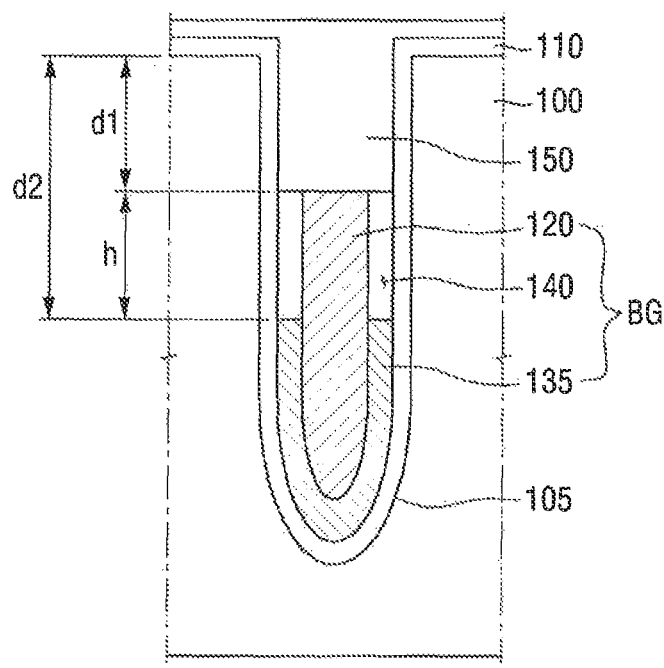

Next, referring to FIG. 5, a top portion of the second gate electrode 135 may be selectively recessed to expose top sidewalls of the first gate electrode 120. The top surface of the second gate electrode 135 may be recessed to the second depth d2 from the top surface of the substrate 100. The second depth d2 may be greater than the first depth d1. The top portion of the second gate electrode 135 may be selectively recessed using a wet etching process. For example, only the top portion of the second gate electrode 135 may be selectively etched using an etching solution having different etching selectivities with respect to the first gate electrode 120 and the second gate electrode 135. Next, referring to FIG. 6, the capping layer 150 filling the trench 105 may be formed on the first gate electrode 120 and the gate insulation layer 110. The bottom surface of the capping layer 150 may be formed to have the first depth d1 from the top surface of the substrate 100. For example, the capping layer 150 may include, for example, an oxide film, a nitride film, or an oxynitride film.

In the forming of the second gate electrode layer 135, a thickness of the second gate electrode layer 135 may be adjusted so as not to be filled with the capping layer 150. For example, the thickness of the second gate electrode 135 (that is, a distance between the gate insulation layer 110 and the first gate electrode 120) may be 30 Å or less, but exemplary embodiments of the present inventive concept are not limited thereto.

Since the recessed portion of the second gate electrode 135 has a narrow gap between the gate insulation layer 110 and the top portion of the first gate electrode 120, the capping layer 150 may be suppressed from being filled in the recessed portion. Accordingly, the air gap 140 may be positioned between the gate insulation layer 110 and the top portion of the first gate electrode 120. The air gap 140 may have a height h corresponding to a difference between the first depth d1 and the second depth d2. In some embodiments, the capping layer 150 may be formed in the recessed portion of the second gate electrode 135, and thereby the bottom surface of the capping layer 150 may be positioned to be lower than the top surface of the first gate electrode 120. Accordingly, the height h of the air gap 140 may be smaller than the difference between the first depth d1 and the second depth d2. For example, the height h of the air gap 140 may be 500 Å or greater, but exemplary embodiments of the present inventive concept are not limited thereto. As the height h increases, the GIDL characteristic and the current amount characteristic can be improved.

Next, referring again to FIG. 1, the capping layer 150 and the gate insulation layer 110 formed on the substrate 100 may be removed so as to expose the top surface of the substrate 100. Portions of the capping layer 150 and the gate insulation layer 110 may be removed by, for example, planarization. Next, impurity regions for forming sources/drains may be formed.

Figure 7:
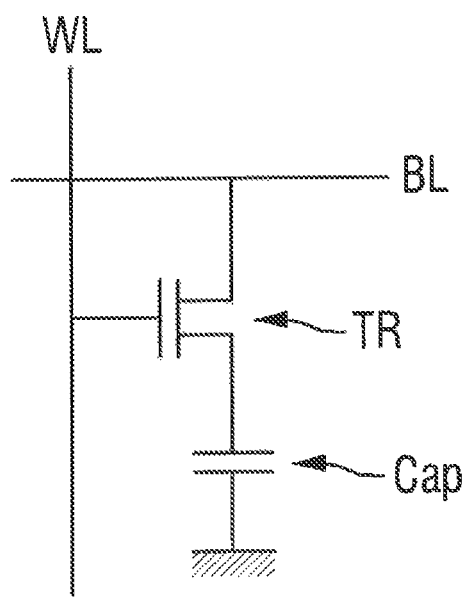
FIG. 7 is a circuit view of a memory cell including the semiconductor device shown in FIG. 1.

FIG. 7 is a circuit view of a memory cell including the semiconductor device shown in FIG. 1. In FIG. 7, a dynamic random access memory (DRAM) cell as an example of a memory cell is illustrated, but the present inventive concept is not limited thereto.

Referring to FIG. 7, the memory cell 20 storing data may be positioned at an intersection of a word line WL and a bit line BL. The memory cell 20 includes a cell capacitor Cap, and a switch transistor TR connected between the bit line BL and the cell capacitor Cap.

A gate of the switch transistor TR may be electrically connected to the word line WL. The source/drain of the switch transistor TR may be connected to one end of the bit line BL/cell capacitor Cap. The other end of the cell capacitor may be connected to a ground voltage. The switch transistor TR may be formed in substantially the same manner as the semiconductor device 1 shown in FIG. 1. The switch transistor TR may be an N type transistor.

Figure 8:
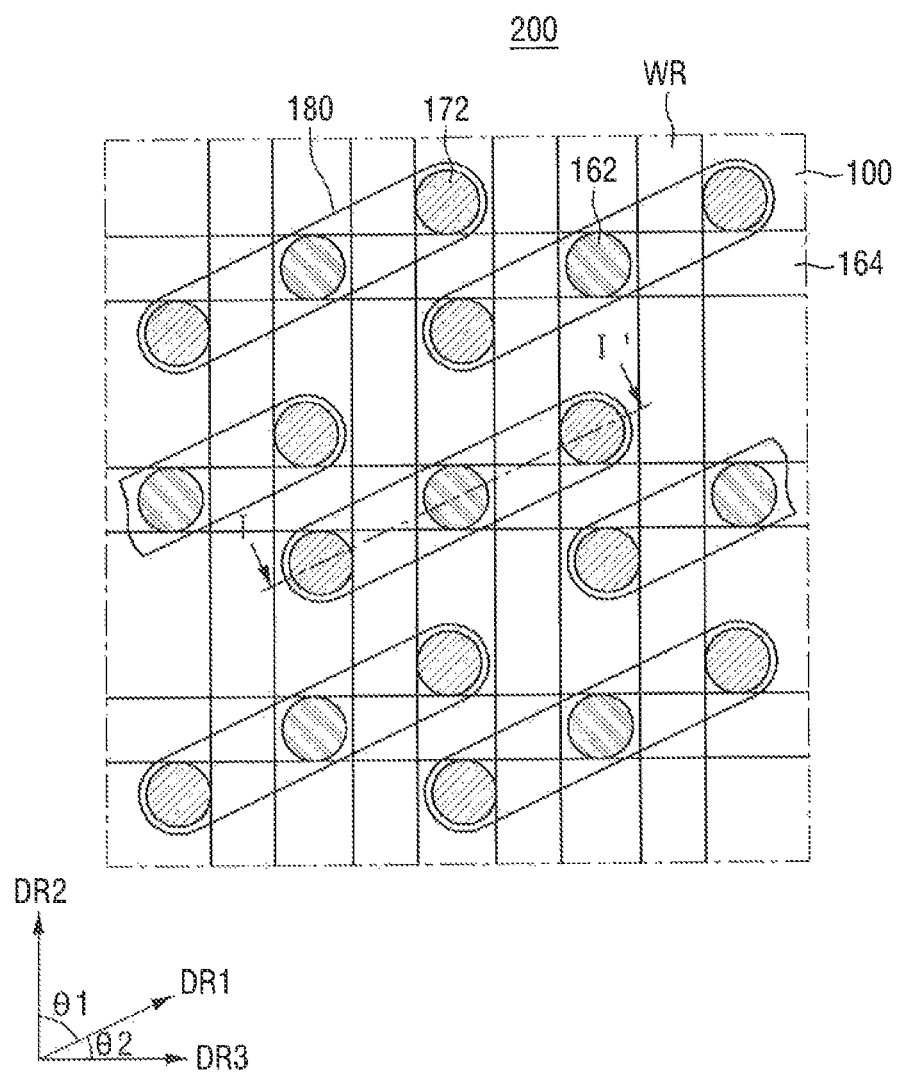
FIG. 8 illustrates a memory cell array including the memory cell shown in FIG. 7.
Figure 9:
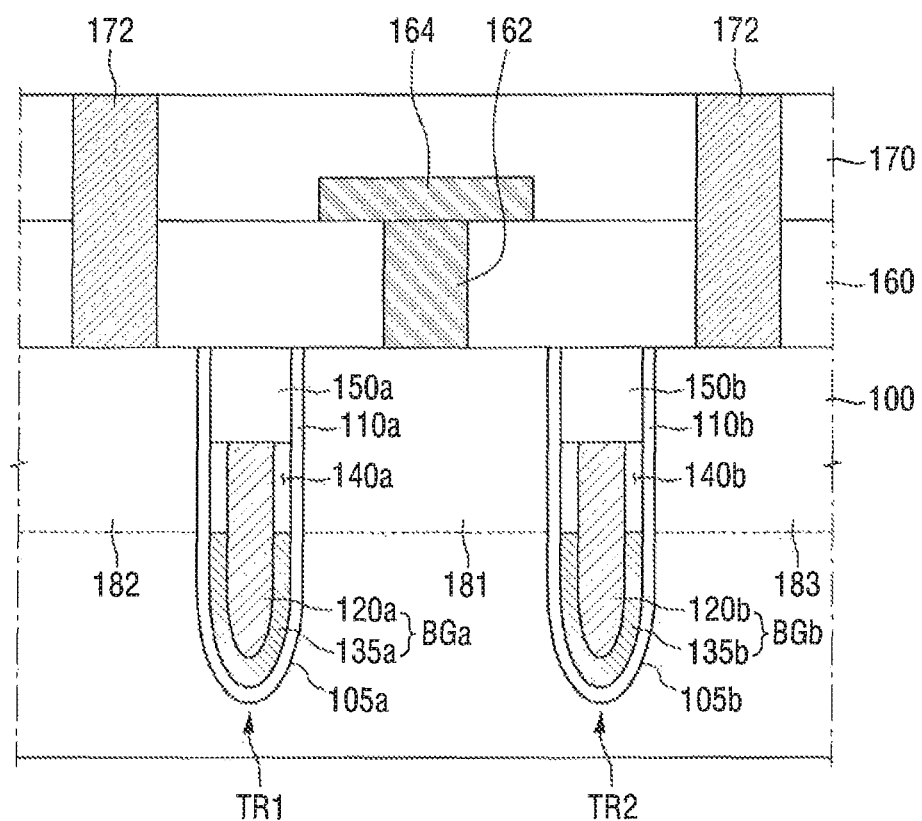
FIG. 9 is a cross-sectional view taken along the line I-I' of FIG. 8.

FIG. 8 illustrates a memory cell array including the memory cell shown in FIG. 7 and FIG. 9 is a cross-sectional view taken along the line I-I' of FIG. 8.

Referring to FIG. 8, the memory cell array 200 includes a unit active region 180. The unit active region 180 may extend in a first direction DR1, a word line WR may extend in a second direction DR2 forming an acute angle with the first direction DR1 and a bit line 164 may extend in a third direction DR3 forming an acute angle with the first direction DR1.

Here, when it is said that "a particular direction and another particular direction form a predetermined angle," the term "angle" used herein means a smaller angle of two angles formed by two directions crossing each other, for example, 60° when angles formed by two directions cross each other are 120° and 60°. Thus, as shown in FIG. 8, the angle formed by the first direction DR1 and the second direction DR2 is θ1, and the angle formed by the first direction DR1 and the third direction DR3 is θ2.

As described above, the reason for θ1 and/or θ2 being acute angles is to obtain a sufficient distance between a bit line 164 and a storage node contact 172 connecting the unit active region 180 to a capacitor (not shown) while reducing the size of the unit active region 180. For example, θ1 and θ2 may be 45° and 45°, respectively; 30° and 60°, respectively; or 60° and 30°, respectively, but exemplary embodiments of the present inventive concept are not limited thereto.

Referring to FIG. 9, two switch transistors TR1 and TR2 may be formed in one unit active region 180. The first switch transistor TR1 may be formed in substantially the same manner as the semiconductor device 1 shown in FIG. 1.

The first switch transistor TR1 may include a gate insulation layer 110a formed in a trench 105a, a first gate electrode 120a filling a portion of the trench 105a, a second gate electrode 135a surrounding a bottom portion of the first gate electrode 120a, and a capping layer 150a formed on the first gate electrode 120a, and an air gap 140a may be positioned between a top portion of the first gate electrode 120a and the gate insulation layer 110a. The second switch transistor TR2 may also include a gate insulation layer 110b formed in a trench 105b, a first gate electrode 120b filling a portion of the trench 105b, a second gate electrode 135b surrounding a bottom portion of the first gate electrode 120b, and a capping layer 150b formed on the first gate electrode 120b, similarly to the first switch transistor TR1, and an air gap 140b may be positioned between a top portion of the first gate electrode 120b and the gate insulation layer 110b.

The first switch transistor TR1 may include a first buried gate electrode BGa including first and second gate electrodes 120a and 135a of the first switch transistor TR1 formed to cross the unit active region 180. The second switch transistor TR2 may include a second buried gate electrode BGb including first and second gate electrodes 120b and 135b of the second switch transistor TR2 formed to cross the unit active region 180. The first and second buried gate electrodes BGa and BGb may be connected to the word line WR shown in FIG. 8.

First and second source/drains 181, 182, and 183 may be formed in the substrate adjacent to the buried gate electrodes BGa and BGb. A first source/drain 181 may be formed between two buried gate electrodes BGa and BGb, and second sources/drains 182 and 183 may be formed adjacent to opposite sides of the first source/drain 181. The first switch transistor TR1 may include the first source/drain 181 and the second source/drain 182, and the second switch transistor TR2 may include the first source/drain 181 and the second source/drain 183. The two switch transistors TR1 and TR2 share the first source/drain 181, while not sharing the second sources/drains 182 and 183.

A bit line contact 162 may be formed on the first source/drain 181, and a storage node contact 172 may be formed on the second sources/drains 182 and 183. An interlayer insulation layer 160 may be formed in the vicinity of the bit line contact 162 and the storage node contact 172. A bit line 164 and an intermetal insulation layer 170 may be formed on the interlayer insulation layer 160 and the bit line contact 162. The storage node contact 172 may be formed while passing through the interlayer insulation layer 160 and the intermetal insulation layer 170. A capacitor (not shown) may further be formed on the storage node contact 172. The first source/drain 181 and the second sources/drains 182 and 183 may be formed to have depths equal to or greater than depths ranging from the top surface of the substrate 100 to top surfaces of second gate electrodes 135a and 135b.

In a case where a source is formed in the first source/drain 181, drains are formed in the second sources/drains 182 and 183. In this case, a depth from the top surface of the substrate to the source 181 may be greater than depths from the top surface of the substrate to the drains 182 and 183. In a case where a drain is formed in the first source/drain 181, sources are formed in the second sources/drains 182 and 183. In this case, depths from the top surface of the substrate to the sources 182 and 183 may be greater than a depth from the top surface of the substrate to the drain 181.

In the memory cell array 200 according to an exemplary embodiment of the present inventive concept, current amounts of the first and second switch transistors TR1 and TR2 can be maximized and GIDL characteristic can be improved owing to air gaps 140a and 140b.

The semiconductor device 1 employing the air gap 140 shown in FIG. 1 may be used as a switching transistor connected to a magnetic tunnel junction (MTJ) for storing data of a magnetoresistive random access memory (MRAM) cell.

Figure 10:
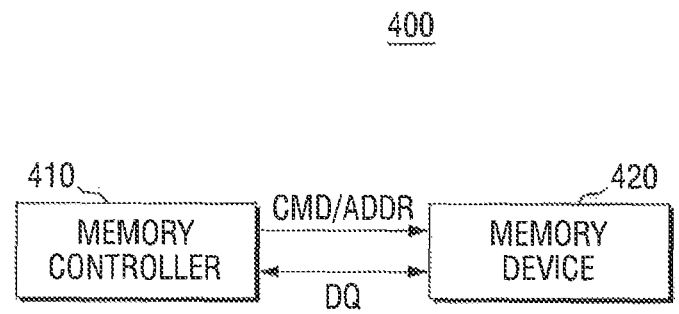
FIG. 10 is a block diagram illustrating a memory system according to some exemplary embodiments of the present inventive concept.

FIG. 10 is a block diagram illustrating an electronic system including memory systems according to some exemplary embodiments of the present inventive concept.

Referring to FIG. 10, the memory system 400 may include a memory controller 410 and a memory device 420.

The memory controller 410 may be configured to control the memory device 420. The memory controller 410 may access the memory device 420 in response to a request from a host. For example, the memory controller 410 may write data in the memory device 420 or may read data from the memory device 420. The memory controller 410 may supply command CMD and an address ADDR to the memory device 420 and may exchange data DQ with the memory device 420. The memory controller 410 may be configured to drive firmware for controlling the memory device 420.

The memory device 420 is configured to store data. For example, the memory device 420 may include a dynamic random access memory (DRAM), such as a double data rate static DRAM (DDR SDRAM), a single data rate SDRAM (SDR SDRAM), a low power DDR SDRAM (LPDDR SDRAM), a low power SDR SDRAM (LPSDR SDRAM), or a direct Rambus DRAM (RDRAM), or a nonvolatile memory, such as a magnetoresistive random access memory (MRAM). The memory device 420 may be configured in substantially the same manner as the memory device including the memory cell array 200 shown in FIGS. 8 and 9.

Figure 11:
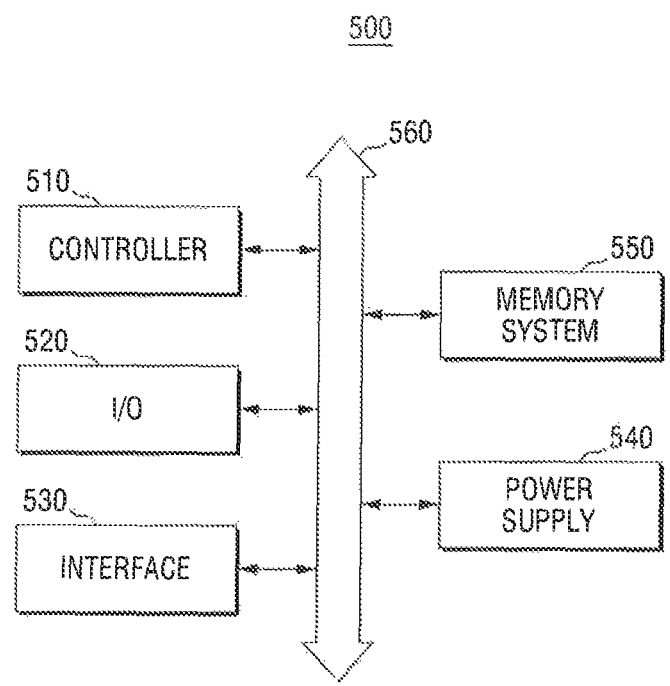
FIG. 11 is a block diagram illustrating an electronic system including memory systems according to some exemplary embodiments of the present inventive concept.

FIG. 11 is a block diagram illustrating an electronic system including memory systems according to some exemplary embodiments of the present inventive concept.

Referring to FIG. 11, the electronic system 500 may include a controller 510, an input/output device (I/O) 520, an interface 530, a power supply 540, and a memory system 550.

The controller 510, the I/O 520, the interface 530, the power supply 540 and the memory system 550 may be connected to each other through a bus 560. The bus 560 may correspond to a path through which data moves.

The controller 510 may include a microprocessor, a microcontroller, and/or logic elements capable of functions similar to those of these elements.

The I/O 520 may include at least one input device, such as a keypad or a touch screen, and/or an output device, such as a speaker or a display device.

The interface 530 may perform wireless communication or a wired communication with an external device. For example, the interface 530 may perform ethernet communication, near field communication (NFC), radio frequency identification (RFID) communication, mobile telecommunication, memory card communication, universal serial bus (USB) communication, and the like.

The power supply 540 may convert externally input power to provide the converted power to the respective components 510 to 550.

The memory system 550 may store the data processed by the controller 510 or may function as a working memory of the controller 510. The memory system 550 may be configured in substantially the same manner as the memory system 400 shown in FIG. 10.

Although not shown, the electronic system 500 may further include a direct memory access (DMA) controller for controlling data input/output. The DMA controller may transfer data between the memory system 550 and various kinds of devices.

In addition, the electronic system 500 may further include nonvolatile memory devices storing a boot image. Examples of the nonvolatile memory devices may include a read-only memory (ROM), a programmable ROM (PROM), an electrically programmable read-only memory (EPROM), an electrically erasable programmable read-only memory (EEPROM), flash memory, a phase-change RAM (PRAM), a resistive RAM (RRAM), a ferroelectric RAM (FRAM), and the like.

According to exemplary embodiments of the present inventive concept, the electronic system 500 may be an electronic system, including a mobile phone, a smart phone, a personal digital assistant (PDA), a portable multimedia player (PMP), a digital camera, a music player, a potable game console, or a navigation device.

While the present inventive concept has been particularly shown and described with reference to exemplary embodiments thereof, it will be understood by those of ordinary skill in the art that various changes in form and details may be made therein without departing from the spirit and scope of the present inventive concept.

What is claimed is:

1. A semiconductor device comprising:
   a substrate;
   a trench formed in the substrate;
   a gate insulation layer conformally formed on the inner surface of the trench;
   a buried gate electrode formed on the gate insulation layer and filling a portion of the trench; and
   a capping layer formed on the buried gate electrodes and filling the trench,
   wherein the buried gate electrode includes a first gate electrode and a second gate electrode surrounding a bottom portion of the first gate electrode, and an air gap is provided between a top portion of the first gate electrode and the gate insulation layer.

2. The semiconductor device of claim 1, wherein the capping layer is formed on the first gate electrode and the air gap.

3. The semiconductor device of claim 1, wherein the air gap is surrounded by the first gate electrode, the second gate electrode, the gate insulation layer and the capping layer.

4. The semiconductor device of claim 1, wherein the second gate electrode surrounds sidewalls of the bottom portion of the first gate electrode and a bottom surface of the first gate electrode.

5. The semiconductor device of claim 1, wherein the air gap is formed at opposite sides of the first gate electrode.

6. The semiconductor device of claim 1, wherein the first gate electrode includes tungsten (W).

7. The semiconductor device of claim 1, wherein the second gate electrode includes titanium nitride (TiN) or tungsten nitride (WN).

8. The semiconductor device of claim 1, wherein the capping layer includes silicon nitride (SiN).

9. The semiconductor device of claim 1, wherein the air gap is surrounded by the first gate electrode, the second gate electrode, the gate insulation layer and the capping layer.

10. The semiconductor device of claim 1, wherein the second gate electrode surrounds sidewalls of the bottom portion of the first gate electrode and a bottom surface of the first gate electrode.

11. A semiconductor device including a switch transistor comprising;
    a substrate;
    a trench formed in the substrate;
    a gate insulation layer conformally formed on the inner surface of the trench;
    a buried gate electrode formed on the gate insulation layer and filling a portion of the trench;
    a capping layer formed on the buried gate electrodes and filling the trench; and
    a source/drain formed in the substrate adjacent to the buried gate electrode;
    wherein the buried gate electrode includes a first gate electrode and a second gate electrode surrounding a bottom portion of the first gate electrode, and an air gap is provided between a top portion of the first gate electrode and the gate insulation layer.

12. The semiconductor device of claim 11, further comprising a capacitor or a magnetic tunnel junction connected to the switch transistor.

13. The semiconductor device of claim 11, wherein the capping layer is formed on the first gate electrode and the air gap.

* * * * *